US010768261B2

(12) United States Patent
Shi et al.

(10) Patent No.: US 10,768,261 B2
(45) Date of Patent: Sep. 8, 2020

(54) ALTERNATING GRADIENTS FOR METAL-INDUCED ARTIFACTS CORRECTION IN MAGNETIC RESONANCE IMAGING

(71) Applicant: The Board of Trustees of the Leland Stanford Junior University, Palo Alto, CA (US)

(72) Inventors: Xinwei Shi, Stanford, CA (US); Brian A. Hargreaves, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 45 days.

(21) Appl. No.: 15/921,495

(22) Filed: Mar. 14, 2018

(65) Prior Publication Data

US 2018/0267126 A1 Sep. 20, 2018

Related U.S. Application Data

(60) Provisional application No. 62/471,569, filed on Mar. 15, 2017.

(51) Int. Cl.
*G01R 33/565* (2006.01)
*G06T 5/00* (2006.01)
*G01R 33/56* (2006.01)
*G01R 33/483* (2006.01)

(52) U.S. Cl.
CPC ... *G01R 33/56536* (2013.01); *G01R 33/5608* (2013.01); *G06T 5/003* (2013.01); *G01R 33/4835* (2013.01); *G06T 2207/10088* (2013.01); *G06T 2207/20221* (2013.01)

(58) Field of Classification Search
None
See application file for complete search history.

(56) References Cited

U.S. PATENT DOCUMENTS

| 7,928,729 B2 * | 4/2011 | Hargreaves | G01R 33/4833 324/307 |
| 8,274,286 B2 | 9/2012 | Koch | |
| 8,405,395 B2 * | 3/2013 | Setsompop | G01R 33/4835 324/309 |
| 8,421,459 B2 | 4/2013 | Koch | |
| 9,360,542 B2 | 6/2016 | Reeder | |
| 2015/0362576 A1 | 12/2015 | Jurrissen | |
| 2018/0136297 A1 * | 5/2018 | Koch | G01V 3/14 |
| 2019/0150781 A1 * | 5/2019 | Koch | A61B 5/055 |

* cited by examiner

*Primary Examiner* — Douglas X Rodriguez
(74) *Attorney, Agent, or Firm* — Lumen Patent Firm

(57) ABSTRACT

A method for magnetic resonance imaging suppresses off-resonance gradient-induced image artifacts due to metal. The method includes performing by a magnetic resonance imaging (MRI) apparatus two multi-spectral imaging (MSI) acquisitions within a field of view of the MRI apparatus, where the two MSI acquisitions have alternating-sign readout gradients. The two MSI acquisitions are then processed and combined by the MRI apparatus using a weighted image combination to produce a final image.

4 Claims, 7 Drawing Sheets

*Fig. 1D* off-resonance field

*Fig. 1E* off-resonance gradient

Fig. 3B local gradient weights (slice B)

RF excitation weights (slice B)

ALTERNATING GRADIENTS FOR METAL-INDUCED ARTIFACTS CORRECTION IN MAGNETIC RESONANCE IMAGING

CROSS-REFERENCE TO RELATED APPLICATIONS

This application claims priority from U.S. Provisional Patent Application 62/471,569 filed Mar. 15, 2017, which is incorporated herein by reference.

STATEMENT REGARDING FEDERALLY SPONSORED RESEARCH OR DEVELOPMENT

This invention was made with Government support under contracts EB015891, EB017739, and EB019723 awarded by the National Institutes of Health. The Government has certain rights in the invention.

FIELD OF THE INVENTION

The present invention relates generally to magnetic resonance imaging (MRI). More specifically, it relates to multi-spectral imaging techniques in MRI and techniques for reducing metal-induced imaging artifacts.

BACKGROUND OF THE INVENTION

Metallic implants can cause substantial image artifacts in magnetic resonance imaging (MRI). Susceptibility variations between metal and surrounding tissue cause significant localized variations in the static magnetic field. These magnetic field variations then cause large resonant frequency variations and significant dephasing of the signal. These effects result in MRI imaging artifacts near the metal, including signal loss, failure of fat suppression, geometric distortion, and bright pile-up artifacts.

Existing multi-spectral imaging (MSI) techniques significantly reduce metal-induced artifacts, but often suffer from residual artifacts in the vicinity of metal due to strong metal-induced off-resonance gradients interfering with the frequency-encoding gradients. These residual artifacts resulting from the limitation of frequency encoding appear as intensity variations, including hyper-intensities (pile-ups) and signal fluctuations (ripples), and may also cause loss of image resolution.

Fully phase-encoded methods can overcome this limitation, but they usually incur prohibitively long scan times. Other existing techniques, including Jacobian-based intensity correction, slice overlap, and deblurring, can reduce the appearance of intensity fluctuations. However, these techniques cannot recover the lost structural information in areas where the off-resonance gradient cancels the frequency-encoding gradient.

BRIEF SUMMARY OF THE INVENTION

The present invention provides a technique to suppress off-resonance-gradient-induced artifacts by combining two MSI acquisitions with alternating-sign readout gradients. In addition, alternating-sign slice-select gradients may also be used in the MSI acquisitions.

This alternating-gradient method significantly reduces off-resonance-gradient-induced artifacts and recovers the lost resolution in the artifact regions, compared with conventional MSI techniques. For example, the known technique of slice overlap can reduce the intensity fluctuations (ripple artifacts) in locations where the off-resonance gradient compresses the imaged slice profiles in the x-z frame ($|G_o+G_x|<|G_x|$) and the off-resonance also varies in the slice direction. However, slice overlap is unable to correct intensity variations and possible resolution loss in readout direction caused by varying magnitude of effective readout gradient. In another example, the known techniques of Jacobian-based intensity correction and deblurring both reduce the intensity variations based on estimated off-resonance field. Jacobian based intensity correction scales the image by the magnitude of estimated effective readout gradient $|G_o+G_x|$. However, it cannot correct the blurring of underlying structures in locations where $|G_o+G_x|<|G_x|$. Deblurring shifts the displaced signals back based on the estimated off-resonance field. When $|G_o+G_x|<|G_x|$ is small, signals of a wide range of off-resonance are shifted to the same voxel and cause pile-up artifacts, the off-resonance frequencies of these signals cannot be resolved from a single-gradient-direction acquisition. Therefore deblurring cannot shift the displaced signals back reliably in this case. In summary, Jacobian correction and deblurring work well in correcting the off-resonance-gradient-induced signal variations in locations where $|G_o+G_x|>|_x|$, but they cannot correct signal pile-ups and resolution loss in locations where $|G_o+G_x|<|G_x|$.

In contrast with the above three methods, the techniques of the present invention use two MSI acquisitions in opposite readout directions, resulting in different locations where $|G_o+G_x|<|G_x|$. Therefore, it can resolve the off-resonance-gradient-induced artifacts, while also avoiding resolution loss.

The alternating-gradient method of the present invention also has advantages over fully phase-encoded methods. Although fully phase-encoded methods can also correct these artifacts because they do not use frequency encoding, they incur prohibitively long scan times due to phase-encodings in all three directions. Considerable acceleration strategies have been proposed for these methods, but these come at an expense of resolution or robustness, and the overall approaches have yet to be demonstrated in a realistic clinical setting. In contrast, the alternating-gradient method of the present invention has a smaller time penalty (2×) compared with fully phase-encoded methods.

In one aspect, the present invention provides a method for magnetic resonance imaging that suppresses off-resonance gradient-induced image artifacts due to metal. The method includes performing by a magnetic resonance imaging (MRI) apparatus two multi-spectral imaging (MSI) acquisitions within a field of view of the MRI apparatus, where the two MSI acquisitions have alternating-sign readout gradients. The two MSI acquisitions are then processed and combined by the MRI apparatus using a weighted image combination to produce a final image. Preferably, the two MSI acquisitions have alternating-sign slice-select gradients and view-angle tilting gradients.

The weighted image combination of the two MSI acquisitions preferably includes weighting a MSI acquisition $m^+$ with weight $w^+$, weighting a MSI acquisition $m^-$ with weight $w^-$, where the weights $w^+$ and $w^-$ include effects of both an RF excitation weight $w_{RF}$ and local gradient weight $w_G$, and where MSI acquisition $m^+$ and MSI acquisition $m^-$ have opposite directions of readout gradients. The RF excitation weight $w_{RF}$ and local gradient weight $w_G$ are preferably determined from a composite field map f. The composite field map f is preferably determined from MSI acquisition m⁺, MSI acquisition m⁻, and corresponding field maps f⁺ and f⁻.

DETAILED DESCRIPTION OF THE INVENTION

In state of the art MRI imaging, severe off-resonance-gradient-induced artifacts, including pile-ups and ripples, appear where the magnetic field gradient due to field inhomogeneities or "off-resonance gradient" $G_o$ is opposite in sign to the readout gradient $G_x$. As a result, the effective readout gradient $G_o+G_x$ in these areas has reduced magnitude. This local reduction in the magnitudes of the readout gradient expands the encoded pixel size, causing irrecoverable loss of resolution in the readout direction. This can also be viewed as a decreased $k_x$ traversal extent. Conversely, where the magnetic field gradient due to field inhomogeneities or "off-resonance gradient" $G_o$ has the same sign as the readout gradient $G_x$, the effective readout gradient $G_o+G_x$ magnitude increases. This additive effect reduces the encoded pixel size, but this effect can be mostly corrected by deblurring and Jacobian-based intensity correction. In two acquisitions, one with the readout gradient $G_x$ inverted with respect to the other, these artifacts appear in different locations. By appropriate combination of two such acquisitions pile-up/ripple artifacts can be suppressed.

Figure 1A:
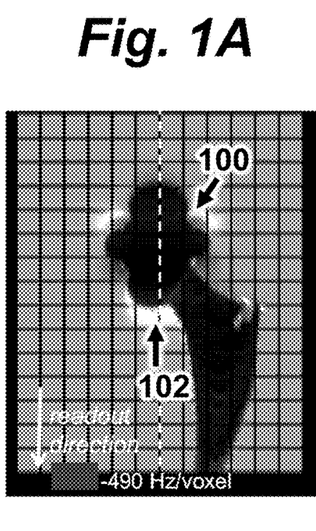
FIG. 1A and FIG. 1B are MRI images with opposing readout directions, according to an embodiment of the invention.
Figure 1B:
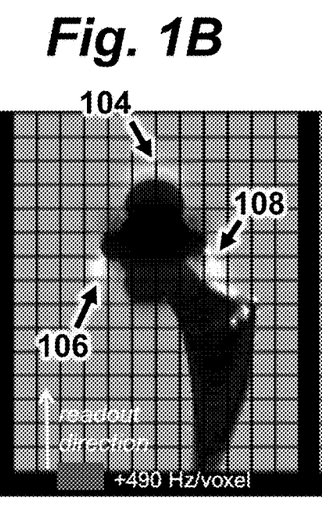
Figure 1C:
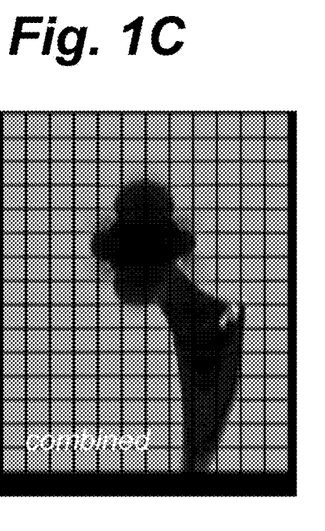
FIG. 1C is a combination of the two images of FIG. 1A and FIG. 1B, with pile-up artifacts suppressed, according to an embodiment of the invention.
Figure 1D:
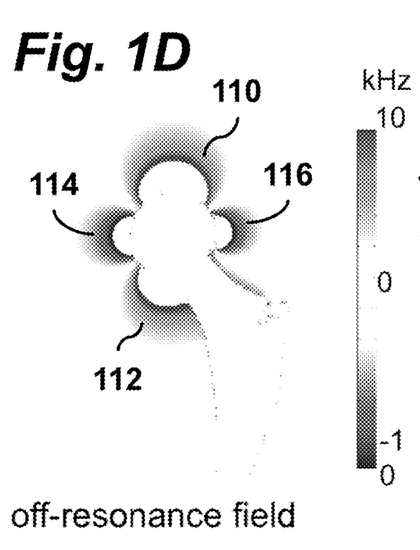
FIG. 1D is an image of an off-resonance field map, with regions of large off-resonance identified, according to an embodiment of the invention.
Figure 1E:
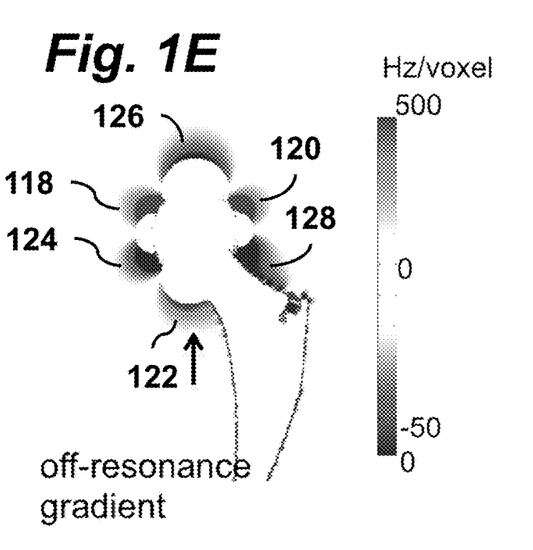
FIG. 1E is an image the off-resonance gradient in the readout direction ($G_o$), identifying regions of rapid off-resonance variations in the readout direction, according to an embodiment of the invention.
Figure 1F:
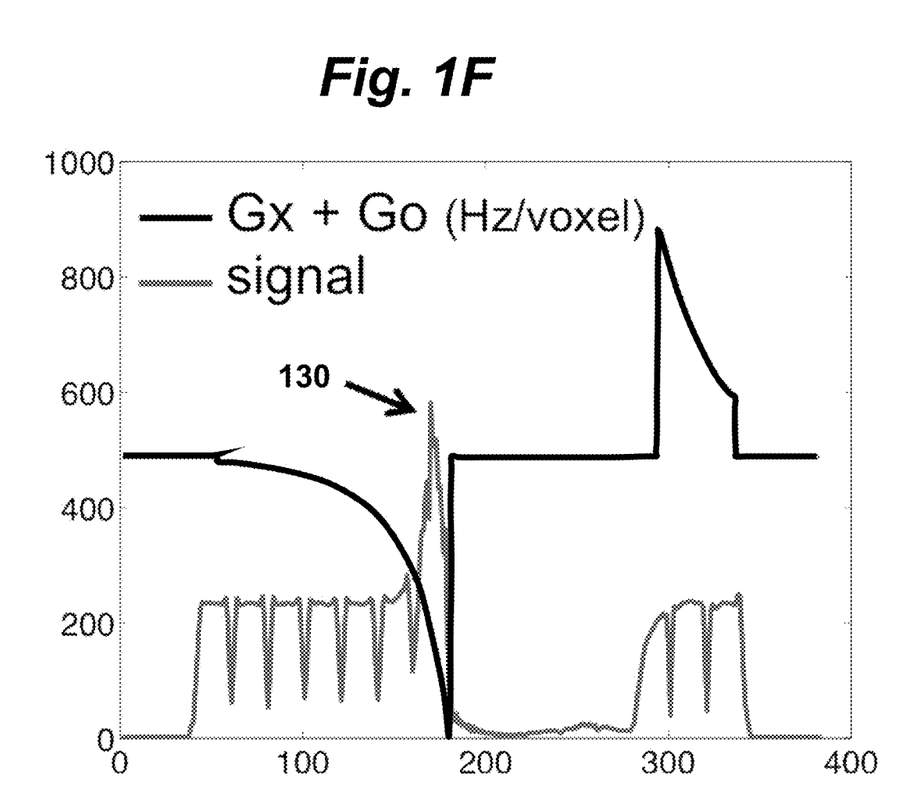
FIG. 1F is a graph of the acquisition signal along the dashed vertical line in FIG. 1A, correlated with the effective readout gradient ($G_x+G_o$), according to an embodiment of the invention.

FIGS. 1A-F demonstrate the correspondence of off-resonance-gradient-induced artifacts and effective readout gradient magnitudes with a simulated MAVRIC-SL acquisition in a digital metal-implant phantom. Specifically, FIG. 1A and FIG. 1B are MRI images with opposing readout directions, and FIG. 1C is the combination of these two images using the techniques of the present invention, with pile-up artifacts suppressed. The localized regions 100, 102, 104, 106, 108 are off-resonance-gradient-induced artifacts including pile-ups and ripples, and blurring of the resolution grid. FIG. 1D is an image of the corresponding off-resonance field map, with localized off-resonance regions 110, 112, 114, 116. FIG. 1E is an image the off-resonance gradient in the readout direction ($G_o$), showing off-resonance regions 118, 120, 122, 124, 126, 128. The graph of FIG. 1F shows the corresponding signal along the dashed vertical line in FIG. 1A, correlated with the effective readout gradient ($G_x+G_o$). The artifacts in these images appear in areas where local off-resonance gradient cancels the applied readout gradient (e.g., region 102 and 122, corresponding to the peak of signal 130).

Figure 1G:
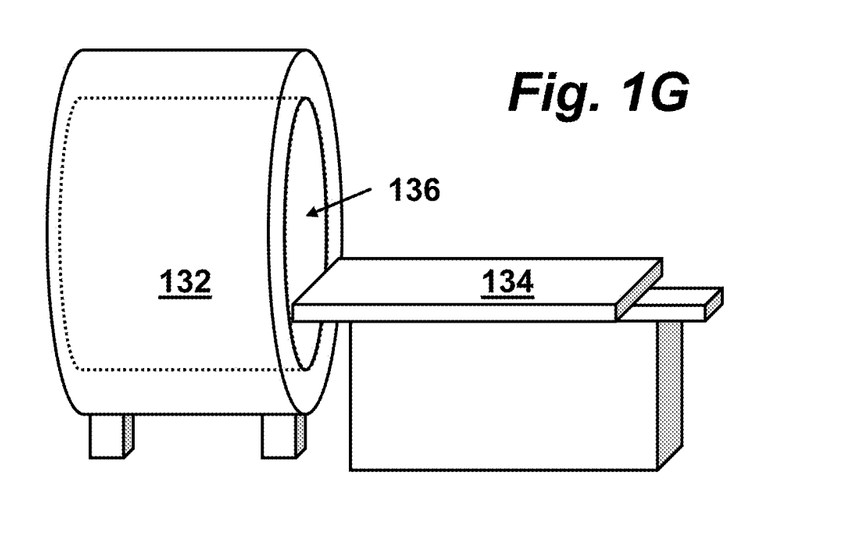
FIG. 1G is a schematic diagram of an MRI apparatus, according to an embodiment of the invention.

FIG. 1G is a perspective view of a conventional MRI apparatus, showing enclosure 132, field of view 136, and gantry 134. According to embodiments of the present invention, the MRI apparatus is operated as follows. The field of view is excited using alternating-gradients acquisition, e.g., using a sequence diagram such as the one shown in FIG. 2A. The diagram shows the signals for RF 200, and signals 202, 204, 206 for gradients $G_z$, $G_y$, $G_x$, in three directions. The solid lines indicate the signals used for acquisition in one gradient direction, while the dashed lines indicate the signals used for acquisition in the opposite gradient direction. The voxel shearing effect caused by view-angle tilting (VAT), used with slice-selective MSI, can be matched between the two gradient directions by additionally inverting the slice-select and VAT gradients $G_z$, which also changes the regions of non-excited signal loss.

Figure 2A:
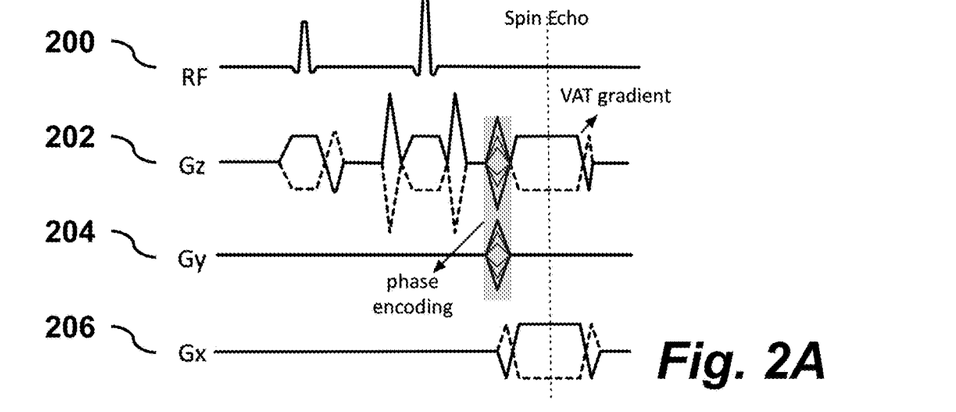
FIG. 2A is a sequence diagram used in an alternating-gradients acquisition, according to an embodiment of the invention.
Figure 2B:
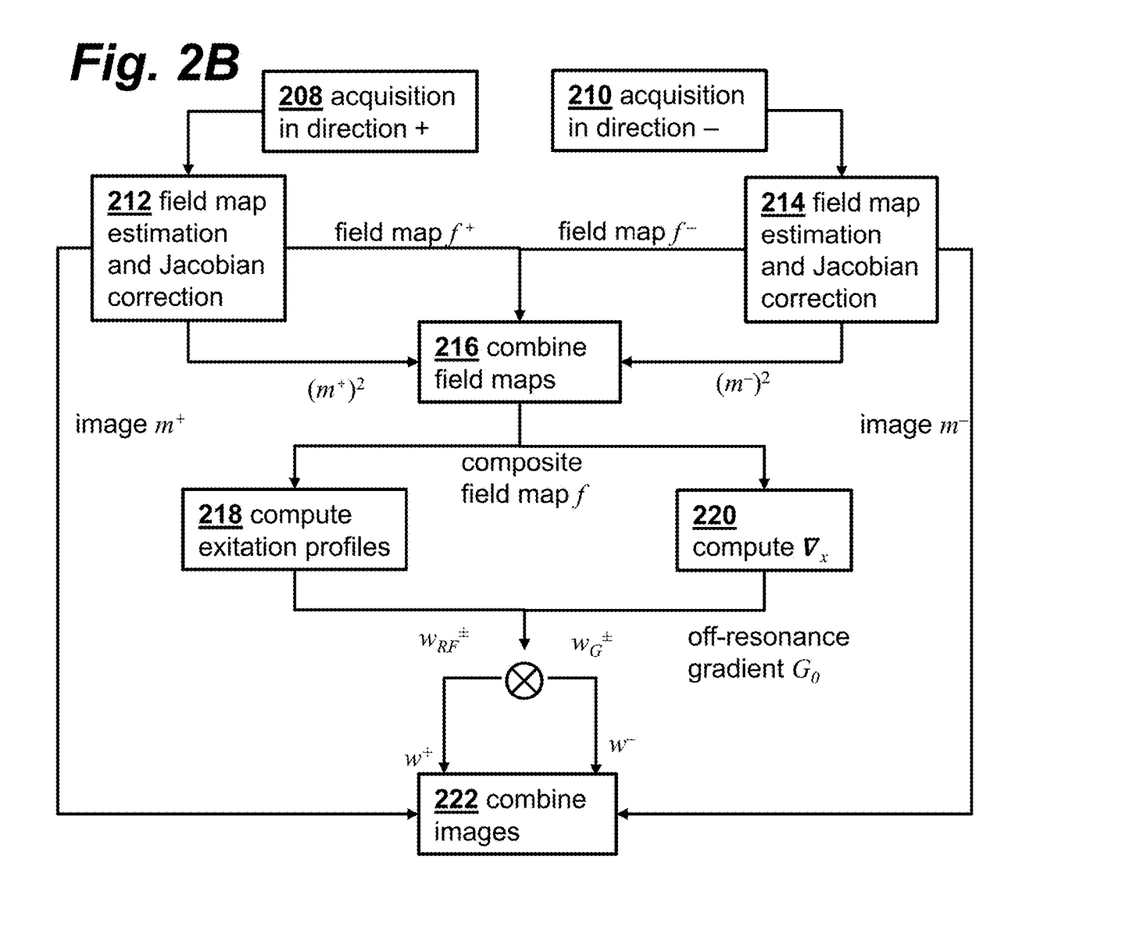
FIG. 2B is an illustration of a reconstruction processing pipeline that exploits the different locations of off-resonance-gradient-induced artifacts and non-excited regions between two alternating gradient acquisitions, according to an embodiment of the invention.

A reconstruction processing pipeline that exploits the different locations of off-resonance-gradient-induced artifacts and non-excited regions between the two acquisitions is illustrated in FIG. 2B. The locations of off-resonance-gradient-induced artifacts are predicted based on the estimated effective readout gradient magnitude $|G_o+G_x|$, and the non-excited regions are predicted based the composite frequency profile and estimated off-resonance frequency. In block 208, acquisition is performed in a first gradient direction. Similarly, in block 210, acquisition is performed in a second gradient direction, opposite to the first direction. In blocks 212 and 214, standard field map estimation, deblurring, and Jacobian-based intensity correction are performed separately for each of the acquired images from the first and second gradient directions. The resulting field maps and composite images are denoted as f⁺, f⁻, and m⁺, m⁻, where superscripts + and − denote the different gradient directions.

In block 216, a composite field map f is obtained by combining the two field maps, as follows:

$$f=[(m^+)^2 f^+ + (m^-)^2 f^-]/[(m^+)^2+(m^-)^2] \qquad [\text{Eq. 1}]$$

In block 220, the off-resonance gradient $G_o$ is computed as the finite difference off along the readout direction. The local gradient weights of each gradient direction are computed as $$w_G^\pm(x, y, z) = \max\left\{\min\left\{1 \pm \frac{G_o(x, y, z)}{G_x}, 1\right\}, 0\right\} \qquad [\text{Eq. 2}]$$

where lower values indicate smaller magnitude of effective readout gradient and thus more severe off-resonance-gradient-induced artifacts.

In block 218, RF excitation weights are computed as $$w_{RF}^\pm(x, y, z) = \sum_b R_b^2\left(f(x, y, z) \pm \frac{\gamma}{2\pi} G_z \cdot z\right) \qquad [\text{Eq. 3}]$$

where the sum is over all bins b, $R_b(\cdot)$ represents RF frequency profile of bin b, and $\gamma$ represents the gyromagnetic ratio. Lower values indicate non-excited regions. In some embodiments, the method uses slice-selective MSI (e.g. MAVRIC-SL, SEMAC). Note that the alternating-gradient techniques of the present invention can also be applied to non-slice-selective MSI. For non-slice-selective MSI, $G_z=0$. Consequently, only the readout gradient $G_x$ needs to be inverted in this case. In the combination scheme, the step of computing the RF excitation weights can be skipped since the excited regions are the same between two gradient directions. Thus, for embodiments using non-slice-selective MSI (e.g. MAVRIC), the slice-select/VAT gradient in FIG. 2A and the step 218 of computing excitation profiles and $w_{RF}$ can be skipped.

In block 222, the weighted image combination is computed as $$m = \frac{w^+ \cdot m^+ + w^- \cdot m^-}{w^+ + w^-} \qquad [\text{Eq. 4}]$$

where the overall weights $$w^+ = \exp\{\alpha w_{RF}^+ + \beta w_G^+\}, \; w^- = \exp\{\alpha w_{RF}^- + \beta w_G^-\} \qquad [\text{Eq. 5}]$$

include the effects of both RF excitation weights and local gradient weights. The scaling factors $\alpha$ and $\beta$ can be selected empirically.

Figure 3A:
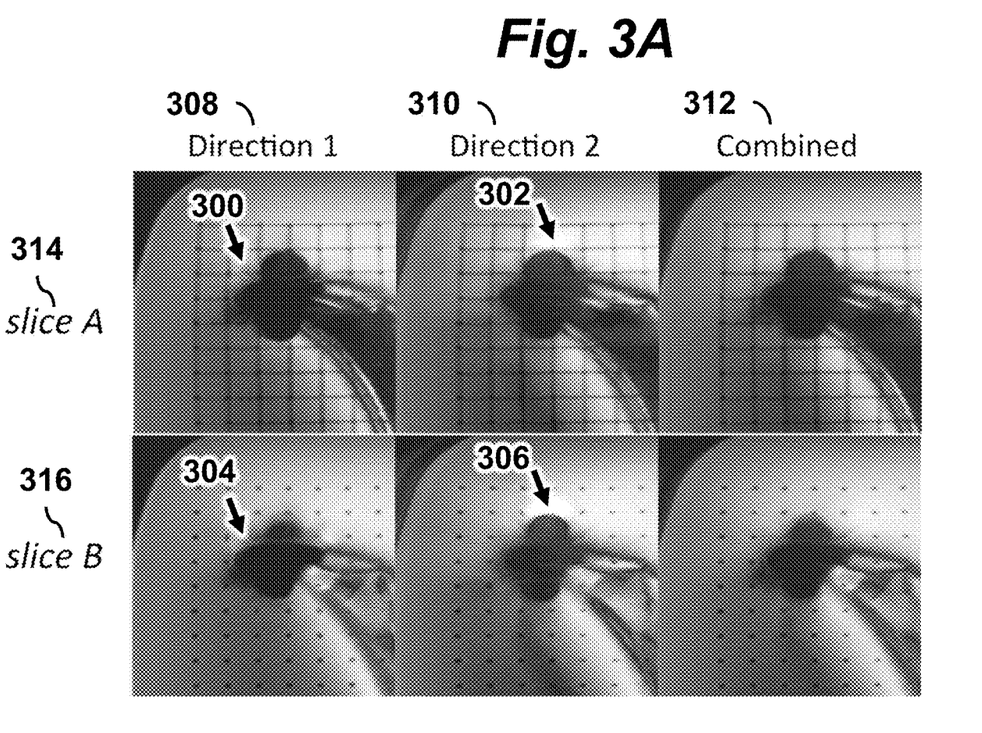
FIG. 3A shows alternating-gradient acquisition images in opposite gradient directions and corresponding combined image for two slices, according to an embodiment of the invention.
Figure 3B:
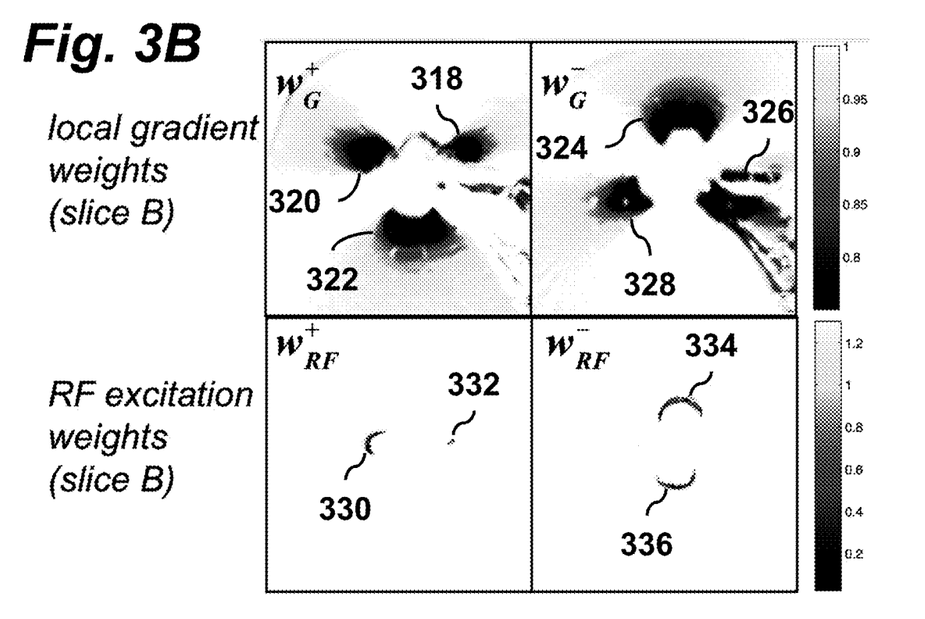
FIG. 3B shows computed local gradient and RF excitation weights in two opposite gradient directions, according to an embodiment of the invention.

Images illustrating the alternating-gradient technique for a hip implant phantom is shown in FIGS. 3A-B.

FIG. 3A is an image grid where columns 308, 310 correspond to acquired images in opposite first and second gradient field directions, and column 312 corresponds to the combined image using the alternating-gradient techniques of the present invention. Rows 314 and 316 correspond to two different acquisition slices. The artifact regions 300, 302, 304, 306 are off-resonance-gradient-induced signal variations and blurring, which are suppressed in the combined image.

FIG. 3B is an image grid where the two rows show, respectively, computed local gradient weights and computed RF excitation weights for slice 316. The two columns correspond to the two gradient field directions 308, 310. The localized regions 318, 320, 322, 324, 326, 328 of the gradient weights match well with the regions of off-resonance-gradient-induced artifacts. The regions 330, 332, 334, 336 of the RF excitation weights indicate non-excited regions of each direction. The data is from a MAVRIC-SL acquisition on a phantom with a total hip replacement and a resolution grid. The following scan parameters were used: $B_0=3T$, matrix size=384×192×24, voxel size=0.8×1.3×3.0 mm$^3$, scan time=7.7 min.

The alternating-gradients acquisition and combination techniques of the present invention can be applied with both slice-selective and non-slice-selective MSI sequences for suppressing off-resonance-gradient-induced artifacts in imaging of various metallic implants. The method can reduce the artificial intensity variations and recover the lost resolution to improve the image quality in close vicinity of metal. Two examples demonstrating the method with MAVRIC-SL are shown in FIG. 4 and FIG. 5.

Figure 4:
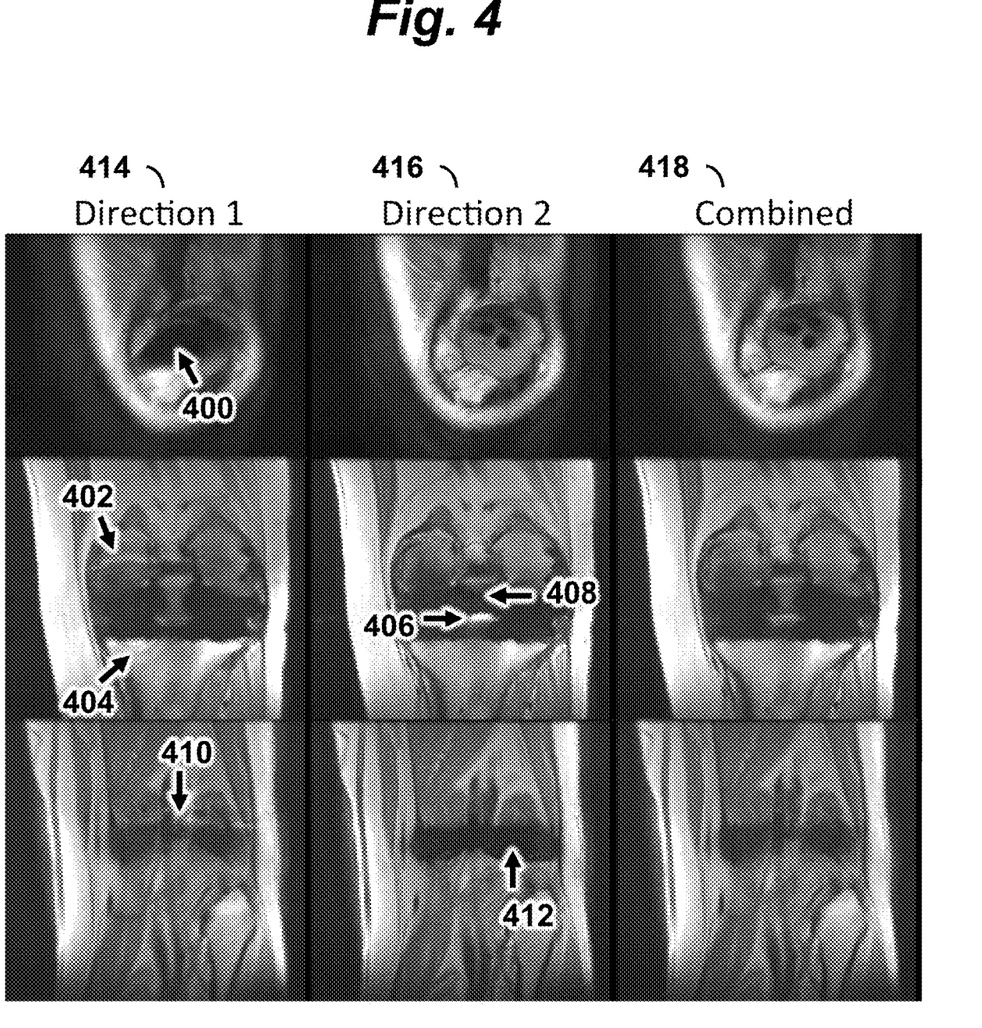
FIG. 4 shows results of the alternating-gradient technique in a volunteer with a total knee replacement, according to an embodiment of the invention.

FIG. 4 shows results of the alternating-gradient technique in a volunteer with a total knee replacement with readout direction superior/inferior. The three columns correspond to three coronal slices on the anterior side, near the center, and on the posterior side, respectively. The dotted arrows 400, 408, 412 point to areas where more signal loss was observed in one gradient direction. The solid arrows 402, 404, 406, 410 point to off-resonance-gradient induced signal variations in images of individual gradient directions.

The following scan parameters were used: $B_0=3T$, matrix size=256×256×24, voxel size=0.7×0.6×4.0 mm$^3$, scan time=6.9 min.

Figure 5:
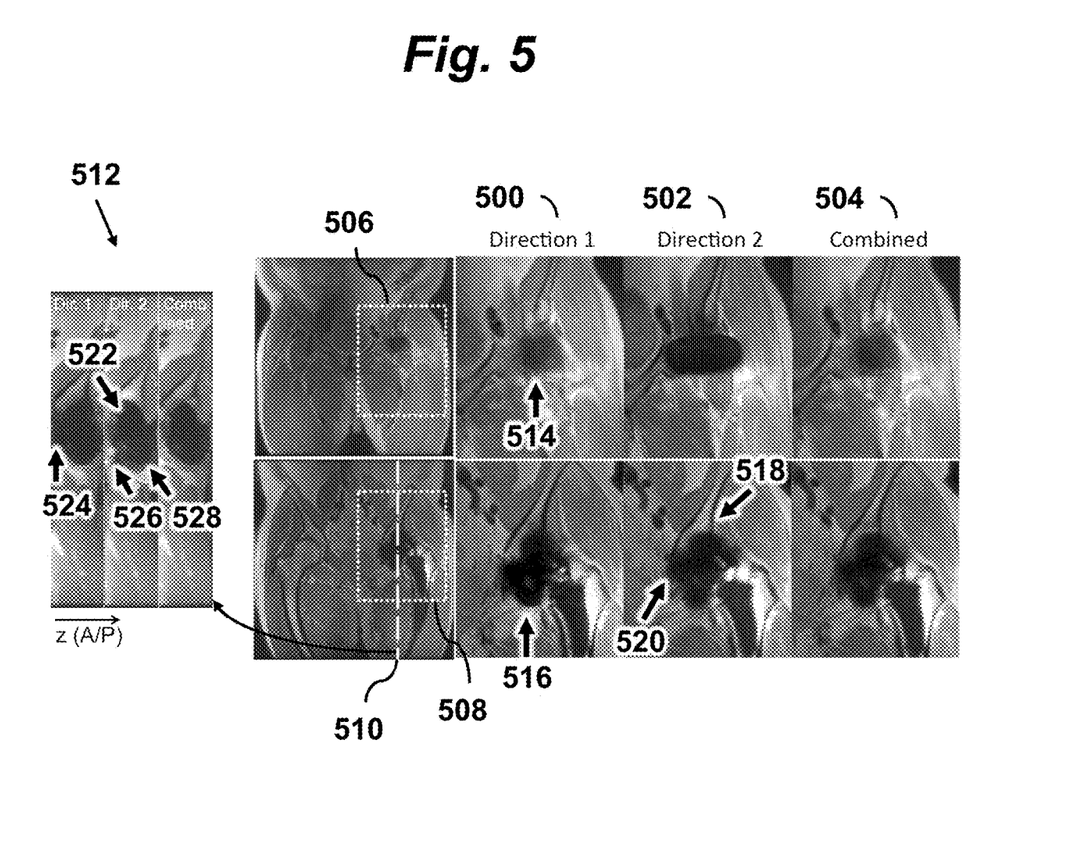
FIG. 5 shows results of the alternating-gradient technique in a patient with a total hip replacement, according to an embodiment of the invention.

FIG. 5 shows results of the alternating-gradient technique in a patient with a total hip replacement. The two rows correspond to different slices. Columns 500 and 502 are acquired images in opposite gradient field directions, detailing regions 506 and 508, respectively. The regions 514, 516, 518, 520 are off-resonance-gradient-induced signal variations in images of individual gradient directions, which were suppressed in the combined images, shown in column 504. It is clear that the combined image recovers substantial signal around the head of the implant that is lost in the individual images. Reformatted sagittal images in different gradient directions across the implant head are shown on the left 512, where the regions 522, 524, 526, 528 point to signal loss. The following scan parameters were used: $B_0=3T$, matrix size=384×256×40, voxel size=1.0×1.5×4.0 mm$^3$, scan time=6.0 min.

In light of the teachings of the present invention, those skilled in the art will appreciate that the principles of the invention are not limited to the specific examples described above for purposes of illustration. Several variations of the technique are possible and envisioned by the inventors.

For example, methods to accelerate the alternating-gradient acquisition can be integrated to the techniques of the present invention to shorten the scan time, including acceleration methods for general MRI acquisitions and specific for MSI.

The total scan time of the two alternating-gradient acquisitions was equal to the conventional scan. A model-based reconstruction method (9) was used to reconstruct the bin images from prospectively under-sampled data.

Figure 6:
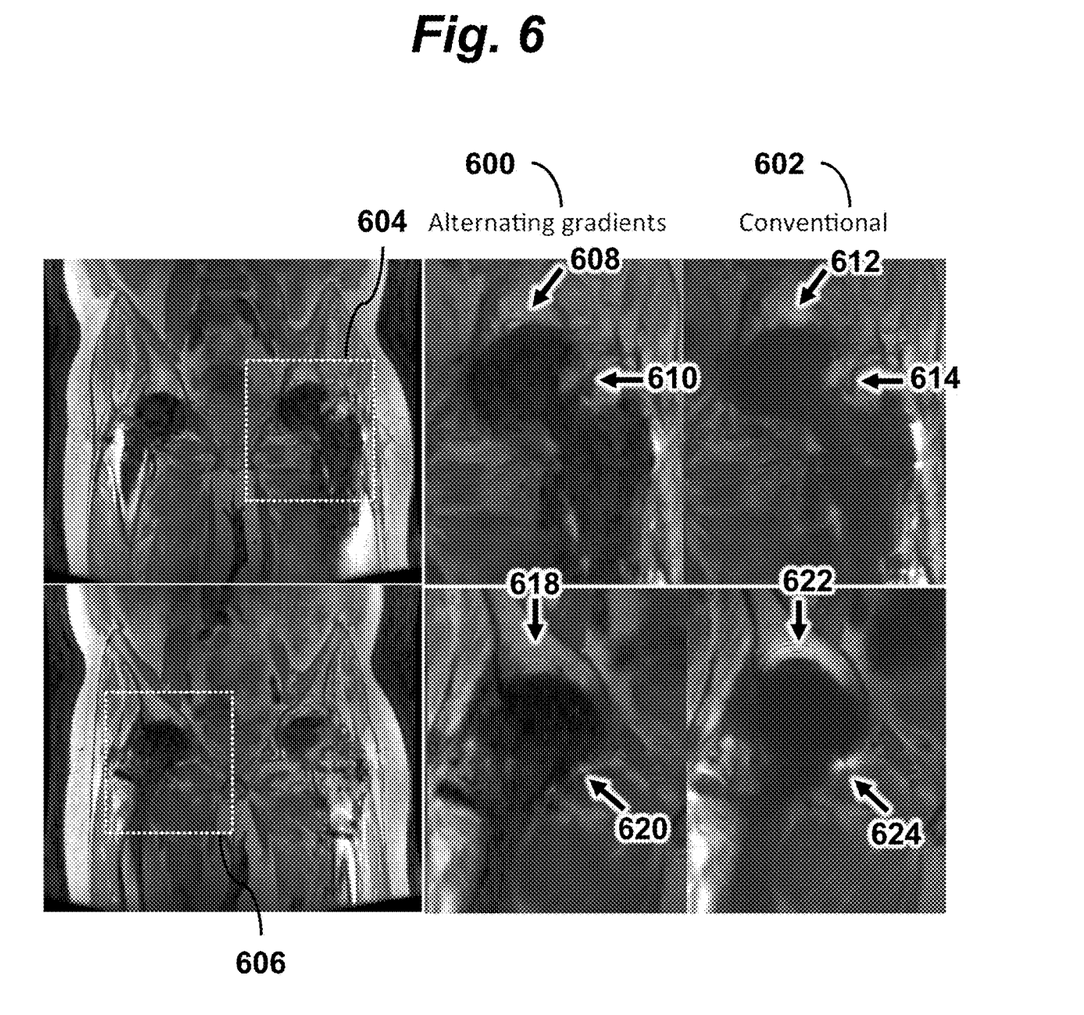
FIG. 6 shows results of the alternating-gradient technique with additional acceleration in a patient with a total hip replacement, according to an embodiment of the invention.

FIG. 6 compares conventional imaging results with results of the alternating-gradient technique with additional 2× acceleration in a patient with a total hip replacement. The two rows correspond to two different slices. Column 600 shows final combined images using the alternating-gradient technique, while column 602 shows the images for a conventional MRI scan. The images in these columns are detail of the regions 604 and 606 in the leftmost column. The alternating-gradient acquisitions were prospectively under-sampled by a factor of 2 in addition to ARC and half-Fourier, and were reconstructed by the model-based reconstruction method. The conventional acquisition was the product MAVRIC-SL sequence (single gradient direction, ARC and half-Fourier sampling). Therefore, their total scan times were the same. The regions 608, 610, 612, 614, 616, 618, 620, 622, 624 are regions where off-resonance-gradient-induced signal variations were present in the acquired images. It is clear that the artifacts were suppressed using the alternating gradient technique (column 600) but not in the conventional technique (column 602). The structures in these areas, which were originally obscured by the artifacts, were revealed in the images of column 600. The following scan parameters were used: $B_0$=3T, matrix size=384×256×48, voxel size=1.0×1.5×4.0 mm$^3$, scan time=7.2 min.

Methods to exploit redundancies in images of the two gradient directions can be added to the proposed method to allow under-sampling of data and thus shorten the scan time. For example, in most part of the FOV away from the metallic implants, the images of the two gradient directions could be the same. This constraint could be enforced in the image reconstruction algorithm to suppress aliasing artifacts due to under-sampling of k-space data.

In MSI, multiple acquisitions are performed with different center frequencies to image spins across a wide range of off-resonance frequencies, and each acquisition is usually referred to as a spectral bin. When performing alternating-gradient acquisitions, spectral bins of two gradient directions can be acquired in an interleaved fashion to reduce the influence of inter-scan motion. Specifically, the acquisition order can be: spectral bin 1 of direction 1, spectral bin 1 of direction 2, spectral bin 2 of direction 1, spectral bin 2 of direction 2, etc.

The computation of the overall weights combining the local gradient weights and RF excitation weights can be modified to suppress artifacts better and to make transitions smoother in the combined image. In the technical description, the multiplications of exponential of local gradient and RF excitation weights are used as the overall weights to linearly combine the images of both directions. Other combination methods can also be used in substitution of the above method. An alternative combination scheme is as follows: step 1, for each voxel, the gradient direction of higher overall weight (computed following Eq. 5) is given weight 1, the other gradient direction is given weight 0, resulting in one binary weight map for each direction; step 2, the weighting maps from step 1 are smoothed around the edges to avoid discontinuities in the combined image. This combination scheme avoids averaging the images of different gradient directions in most part of the FOV and possible blurring due to the averaging operation.

Other metrics of image quality of individual gradient directions can be integrated to the overall weights. For example, gradient entropy can be used to evaluate the level of motion artifacts in images of individual directions, and suppress motion artifacts in the combined image.

The invention claimed is:

1. A method for magnetic resonance imaging that suppresses off-resonance gradient-induced image artifacts due to metal, the method comprising:
    performing by a magnetic resonance imaging (MRI) apparatus two multi-spectral imaging (MSI) acquisitions within a field of view of the MRI apparatus, where the two MSI acquisitions have alternating-sign readout gradients during signal readout; and
    processing and combining by the MRI apparatus the two MSI acquisitions using a weighted image combination to produce a final image;
    wherein combining the two MSI acquisitions using the weighted image combination comprises weighting a MSI acquisition $m^+$ with weight $w^+$, weighting a MSI acquisition $m^-$ with weight $w^-$, where the weights $w^+$ and $w^-$ include effects of both an RF excitation weight $w_{RF}$ and local gradient weight $w_G$, and where MSI acquisition $m^+$ and MSI acquisition $m^-$ have opposite directions of readout gradients.

2. The method of claim 1 wherein the two MSI acquisitions have alternating-sign slice-select gradients and view-angle tilting gradients.

3. The method of claim 1 wherein the RF excitation weight $w_{RF}$ and the local gradient weight $w_G$ are determined from a composite field map f.

4. The method of claim 3 wherein the composite field map f is determined from MSI acquisition $m^+$, MSI acquisition $m^-$, and corresponding field maps $f^+$ and $f^-$.

* * * * *